United States Patent [19]
Pelella

[11] Patent Number: 5,982,203
[45] Date of Patent: Nov. 9, 1999

[54] TWO STAGE SRCMOS SENSE AMPLIFIER

[75] Inventor: Antonio R. Pelella, Highland Falls, N.Y.

[73] Assignee: International Business Machines Corporation, Armonk, N.Y.

[21] Appl. No.: 09/004,869

[22] Filed: Jan. 9, 1998

[51] Int. Cl.[6] .................................................. G11C 7/06
[52] U.S. Cl. ............................................................ 327/57
[58] Field of Search ................................. 327/51–57, 143, 327/198, 544; 365/185.21

[56] References Cited

U.S. PATENT DOCUMENTS

| | | | |
|---|---|---|---|
| 3,879,621 | 4/1975 | Cavaliere et al. | 327/57 |
| 5,023,841 | 6/1991 | Akrout et al. | 327/51 |
| 5,036,231 | 7/1991 | Kanbara | 327/55 |
| 5,228,106 | 7/1993 | Ang et al. | 365/208 |
| 5,491,667 | 2/1996 | Sharp | 327/51 |

*Primary Examiner*—Toan Tran
*Attorney, Agent, or Firm*—Lynn L. Augspurger

[57] ABSTRACT

A high performance "two stage" (or cascading) Self-resetting CMOS (SRCMOS) amplifier where the 2nd stage amplifier is self-timed off of the 1st stage. Also, the SRCMOS nature of this amplifier eliminates the need for additional reset clock signals. The net affect of this invention is that the sensing action of a SRAM cell can start sooner (relative to a single stage sensing scheme) thereby delivering the data to the outputs sooner while providing greater noise immunity when compared to traditional sense amplifiers.

8 Claims, 6 Drawing Sheets

TWO STAGE SRCMOS SENSE AMPLIFIER

FIELD OF THE INVENTION

This invention is related to SRAM and memory design and in particular to sensing and amplifying the state of SRAM memory cells quickly.

BACKGROUND OF THE INVENTION

The preferred embodiment is designed to fulfill a need to provide for fast sensing when a large number of SRAM cells share a common bit line and when many bit lines share a common sense amplifier.

SUMMARY OF THE INVENTION

This invention provides a two stage (or cascading) Self-resetting CMOS (SRCMOS) amplifier. The 2nd stage amplifier is self-timed off of the 1st stage. Also, the SRCMOS nature of this amplifier eliminates the need for additional reset clock signals.

The net affect of this invention is that the sensing action of a SRAM cell can start sooner (relative to a single stage sensing scheme) thereby delivering the data to the outputs sooner.

These amplifier improvements are accomplished by providing a 1st stage sense amplifier with NFET output transistors and with low input capacitance as seen by the memory cells. Furthermore, the 1st stage sense amplifier delivers a re-powered differential voltage to the 2nd stage sense amplifier. This allows the 2nd stage sense amplifier to be constructed of cross-coupled NFETS (which have 2 times the drive capability compared to a similarly sized PFET transistor) resulting in a faster, smaller 2nd stage sense amplifier.

These and other improvements are set forth in the following detailed description. For a better understanding of the invention with advantages and features, refer to the description and to the drawings.

Our detailed description explains the preferred embodiments of our invention, together with advantages and features, by way of example with reference to the following drawings.

DETAILED DESCRIPTION OF THE INVENTION

Before considering our preferred embodiments in detail, it may be worthwhile to illustrate a common situation in which a two stage sensing scheme would be very useful. Consider a situation where 1-of-16 bit line pairs are to be read out. Also, each bit line pair has 256 SRAM memory cell attached. These situations are becoming more common as the need for greater array efficiency (total SRAM cell area(sq um)/total SRAM area(sq um)) drives L1 Cache density to every larger sizes.

Turning now to our invention in greater detail, the net affect of this two stage sensing is the sensing action can start sooner (relative to a single stage sensing scheme) thereby delivering the data to the outputs sooner.

Figure 1:
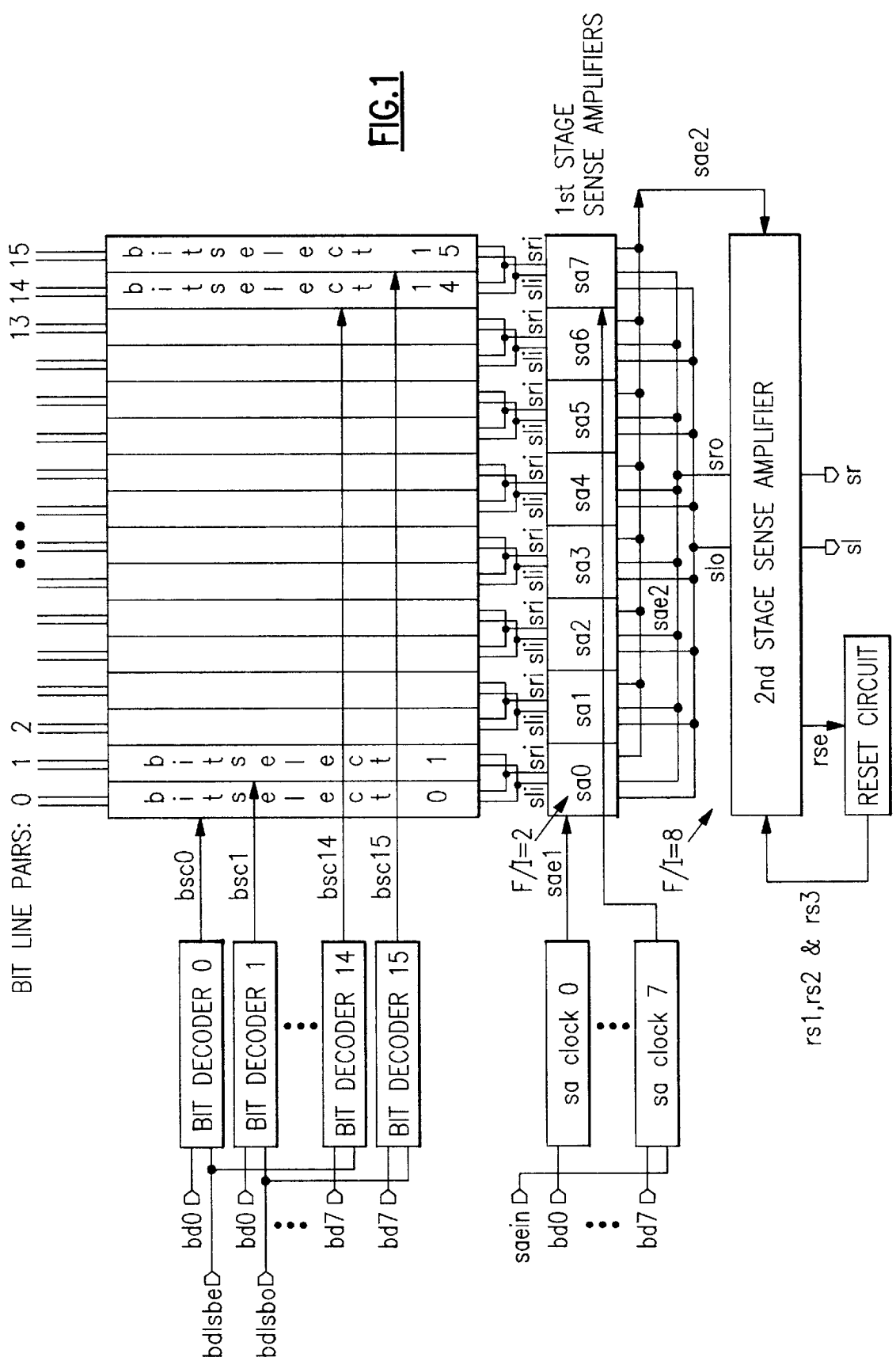
FIG. 1 shows schematically an overview of the preferred embodiment and particularly shows the two stage amplifier and it's connections to the surrounding circuits: bit-selector, bit-decoders, and sense-amp clock circuits.
Figure 2:
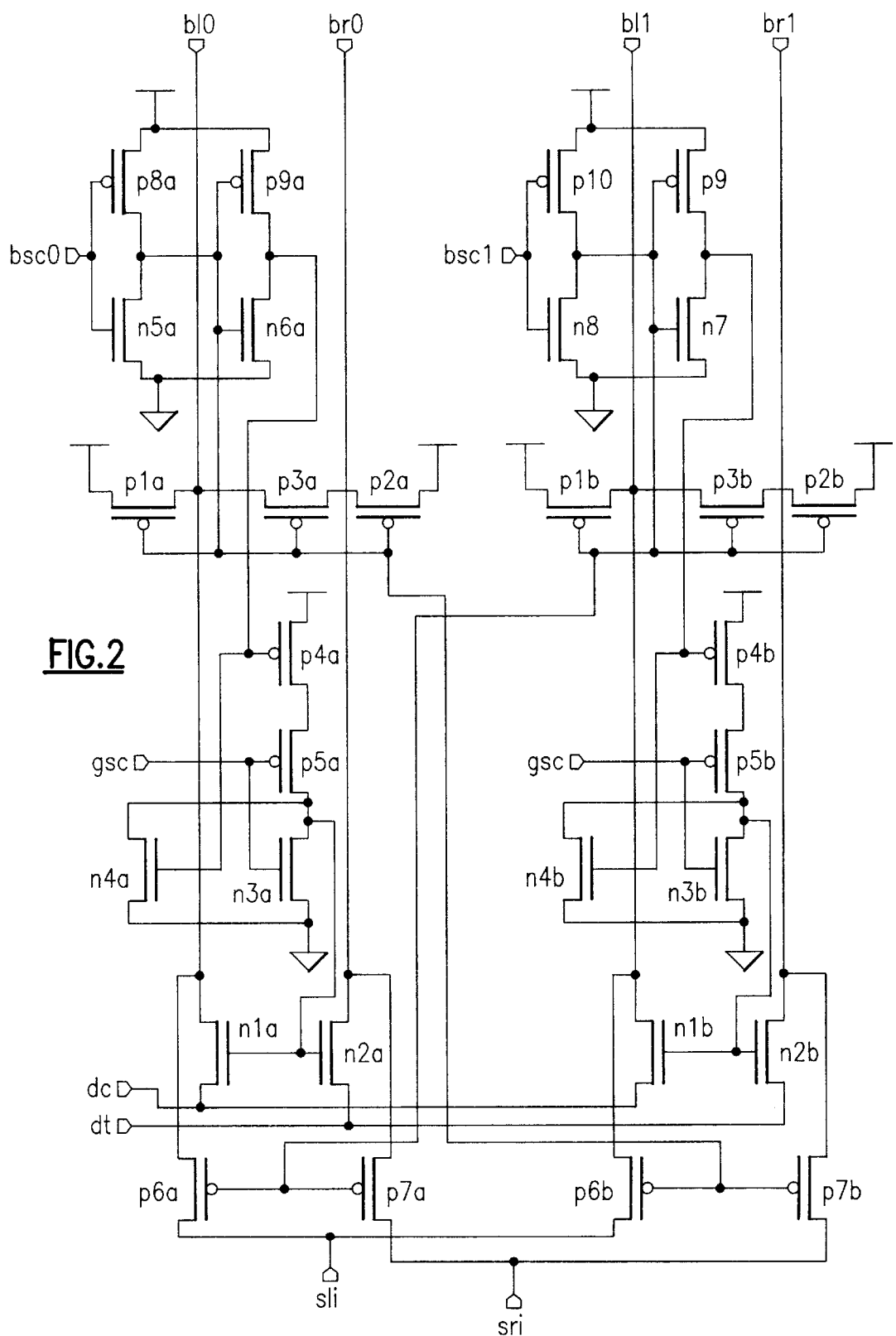
FIG. 2 shows a bit-select circuit.
Figure 3:
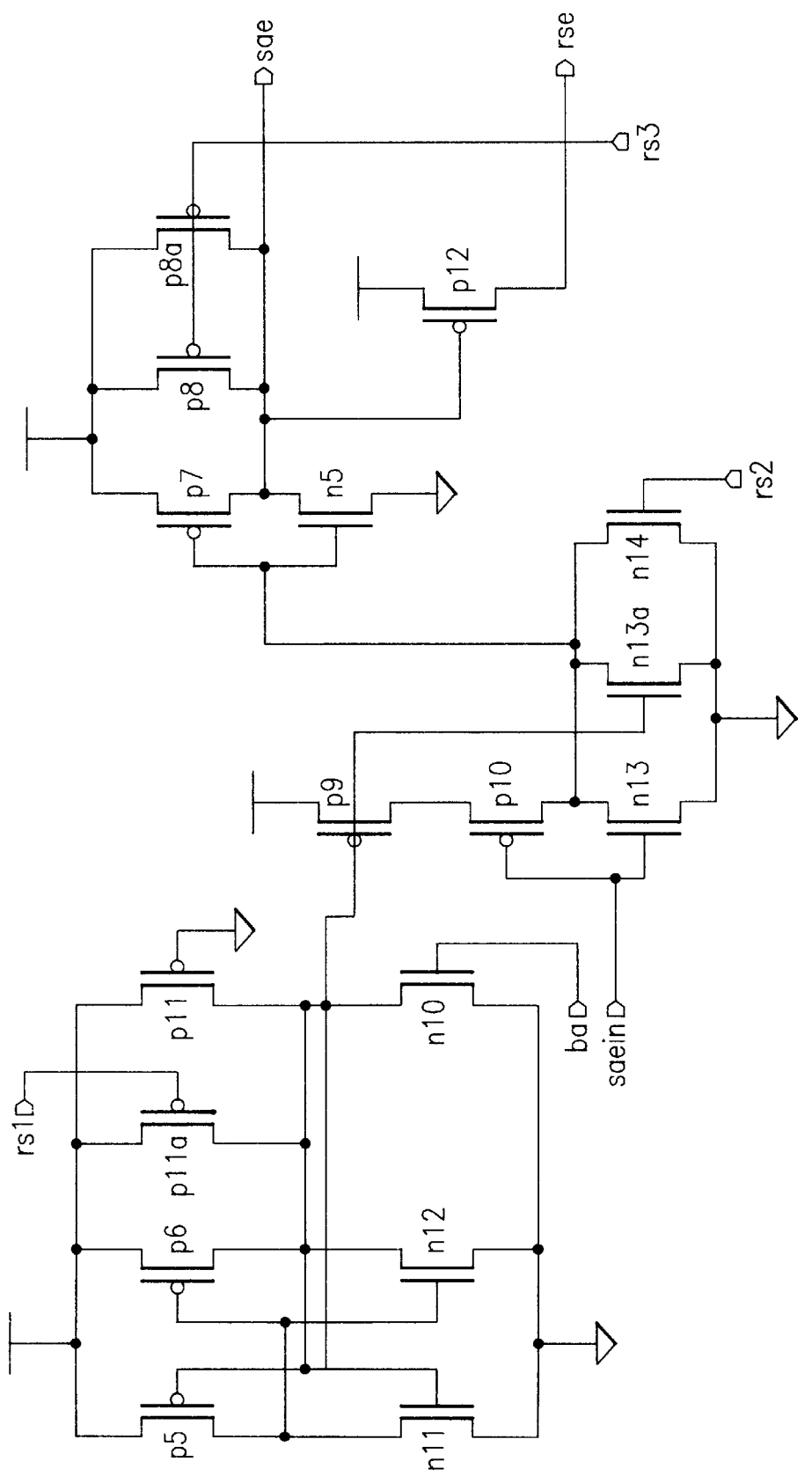
FIG. 3 shows a sense-amp clock circuit.

FIG. 1 which illustrates our preferred embodiment shows the two stage sensing scheme surrounded by the bit-decode logic, sense amp clocking logic, and the bit line selection circuitry. Note that the bit decode circuits and the sense amp clock circuits share the same high order bit address. This guarantees that the correct combination of 1st stage sense amp and bit lines will be activated at the same time. As shown, two pair of bit lines share one 1st stage sense amp. Therefore, the memory cells see a fan-in of 2 at the input of the 1st stage sense amp. Then eight 1st stage sense amps are connected to one 2nd stage sense amp to achieve a 1-of-16 bitline sensing scheme. In contrast, a traditional sensing scheme would have 16 bit line pair feeding into 1 sense amp (resulting in a fan-in of 16, as seen by the memory cells). To guarantee safe sensing action, the SRAM cell needs to generate 200 millivolts of voltage differential at the 1st stage amp inputs. Since, the fan-in is only 2 bitlines, the 200 mv is generated much sooner as compared with a fan-in of 16. This allow the 1st stage amplifier to be triggered much sooner vs. a single stage amplifier with a fan-in of 16. Once triggered, the 1st stage sense amp sends a 200 mv differential to the 2nd stage amplifier along with a trigger signal to start the 2nd stage amplification.

Advantages of this two Stage Sensing Scheme

Figure 4:
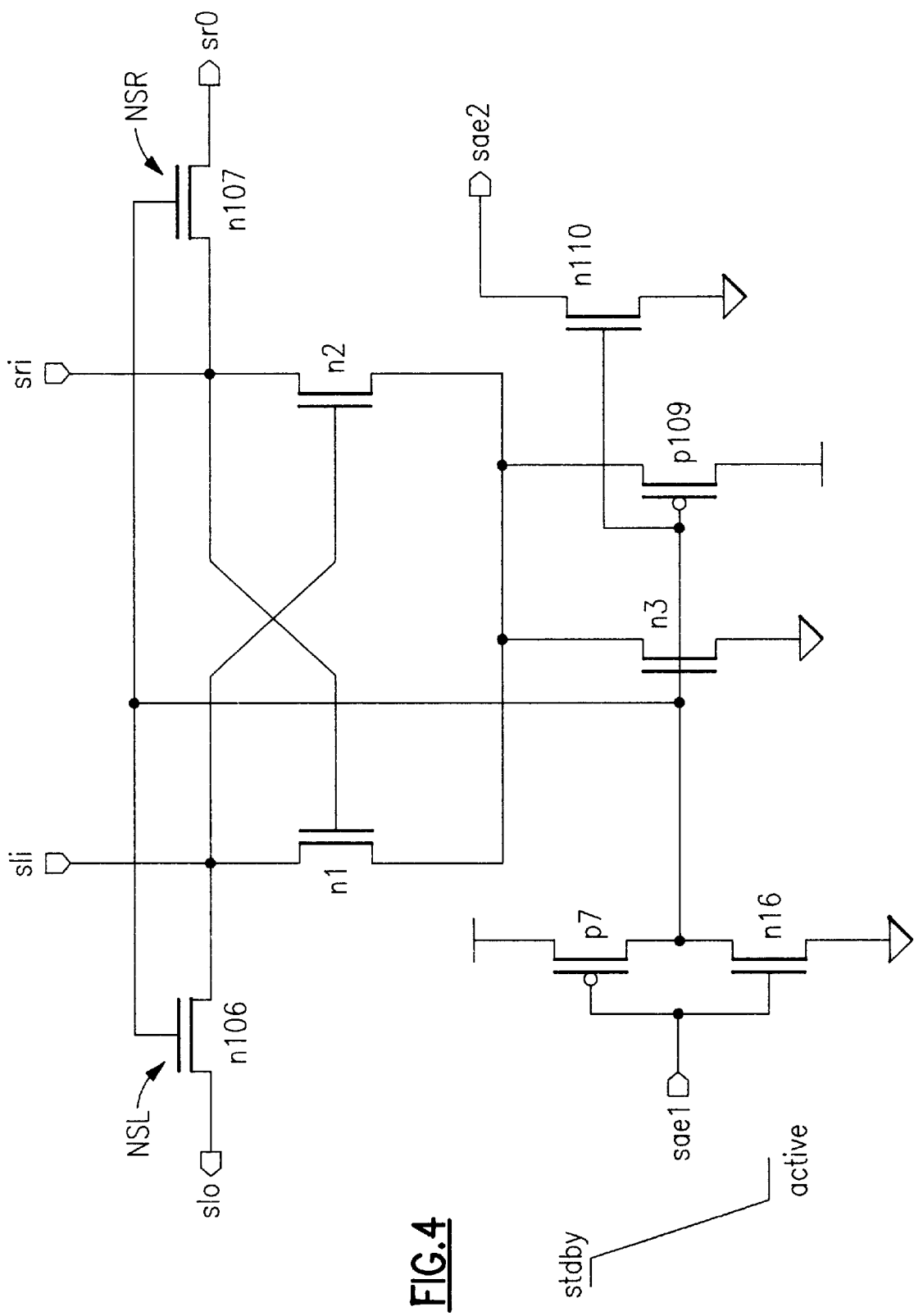
FIG. 4 shows a 1st stage sense amplifier circuit.

1) The 1st stage sense amp, shown in FIG. 4, delivers a repowered differential voltage to the 2nd stage sense amp. This allows the output devices of the 1st stage amp (Nsl & Nsr) to be NFET's which are 2×smaller than a PFET of equivalent strength. As a result, the 1st & 2nd stage sense amplifier have relatively low input capacitance. (Note: traditional sense amplifiers use PFET pass gates to pass small differential voltages from the bitlines into the sense amplifiers, one PFET pass gate per bitline. Here the 2nd stage sense amplifier uses NFET pass gates.)

Figure 5:
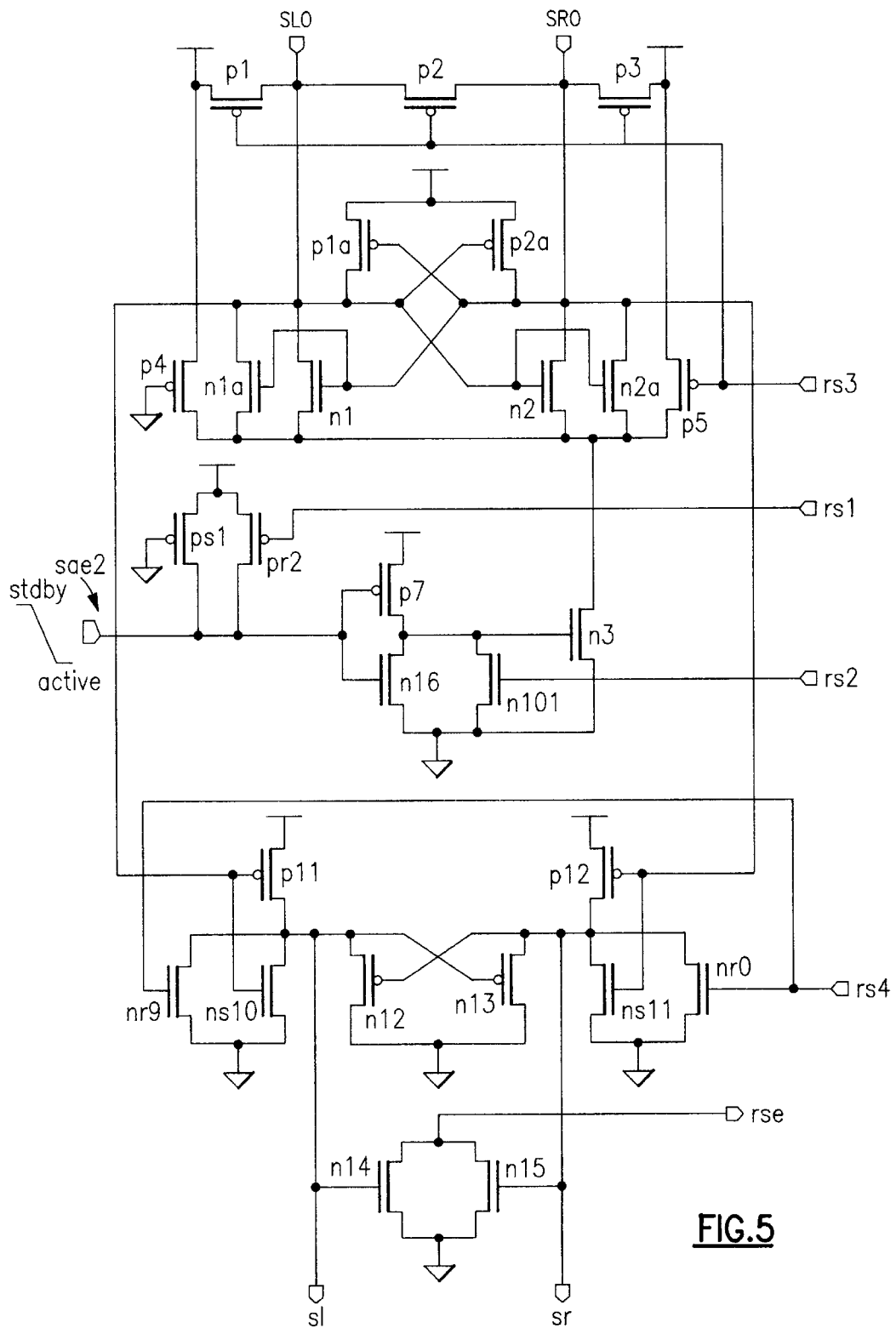
FIG. 5 shows a 2nd stage sense amplifier circuit.
Figure 6:
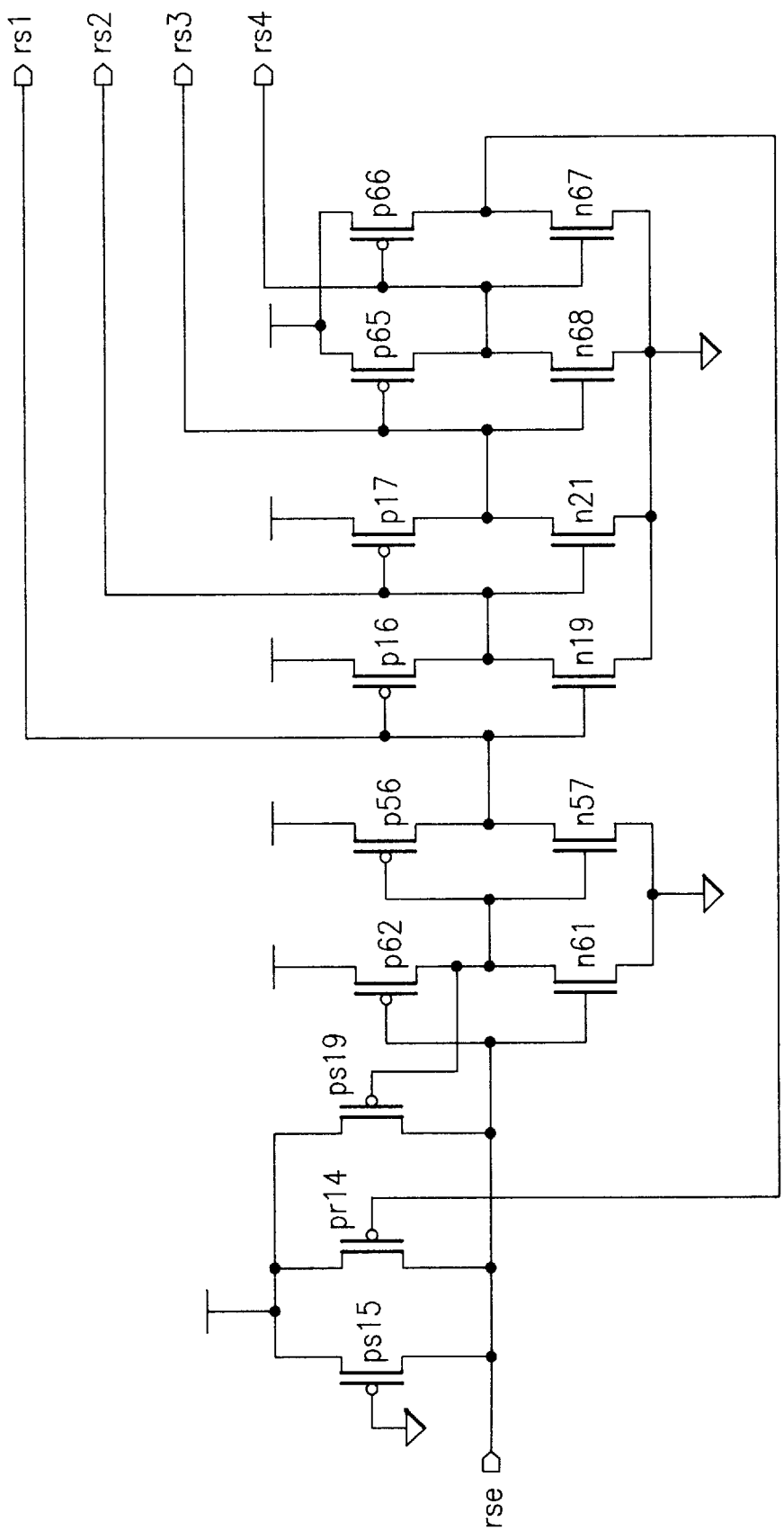
FIG. 6 shows a 2nd stage sense amplifier reset circuit.

2) The 2nd stage sense amp, shown in FIG. 5, is self-timed off of the 1st stage sense amp. This greatly reduces the burden of generating 2 closely timed sense amp clock signals (one for the 1st stage & another for 2nd stage a little while later). Referring to FIG. 4, when the sense amp clock signal "sae" arrives at the 1st stage sense amp, it initiates the amplification process and generates the output signal "sae2". The sae2 node of all 8 1st stage sense amps are "wire-ORed" into the 2nd stage sense amp. As a result, if any of the eight 1st stage sense amps are activated, the signal "sae2" is generated, triggering the 2nd stage sense amp. This allow the clock signals "sae" and "sae2" to track very closely with varying chip-to-chip transistor characteristics and environmental conditions.

3) When additional bitline pair are added to this sensing scheme, only a marginal slow-down in performance is observed. For example, from the time the memory cell is selected, sensing 1-of-32 bitlines is only marginally slower than a 1-of-16 bitlines sensing, not 2× slower. For example, the major part of the sensing delay occurs while waiting for 200 mv to appear at the inputs of the 1st stage sense amp. Therefore, with a traditional sense amp, the memory cell is directly loaded down by the increase of more bit lines. Whereas, the two stage scheme described in this invention, the capacitive loading on memory cells is constant at 2 bitlines. However, the 1st level sense amp will see a 2× increase in output capacitance (when going to 1-of-16, to a 1-of-32), but it has much more drive capability than the memory cell. As a result, the time delay waiting for the 1st stage sense amp to generate 200 mv at the input of the 2nd stage sense amp is still relatively short as compared to the development of the original 200 mv at the 1st stage sense amp's input.

4) Since the first stage amplifier's output transistors (FIG. 4, Nsl & Nsr) are controlled by the sense amplifier trigger signal "sae1", no voltage differential can pass through to the 2nd stage amplifier until "sae1" arrives. This situation prevents large bitline voltage differentials from self-triggering the 2nd stage amp. For example, during a write-through (reading the bitlines during a write operation) the voltage differential on the bitlines may be equal to the supply voltage. This occurs because the large write-port transistors are creating the voltage differential and not the small memory cell transistors. If this differential were to make its way to the 2nd stage amplifier inputs, it could cause its output to change states before being triggered by "sae2". This could cause the 2nd stage amplifier to activate twice (in the same cycle), once by the write-through voltage and again when "sae2" arrives. This double activation or "pulsing" could cause down stream logic to fail. However, double pulsing is prevented with the 2 stage sensing scheme described in this invention.

5) An additional benefit of the 1st stage sense amp is that its output NFET's (FIG. 4, Nsl & Nsr) will not allow any signal smaller than a Vt to pass to the 2nd stage sense amp. In other words, if bit line noise causes both inputs of the 1st stage sense amp to dip a few hundred millivolts, that noise will not be passed through to the 2nd stage sense amplifier. On the other hand, if PFET pass-gates were used, bit line noise would be pass directly to the 2nd stage sense amp resulting is a more noisy 2nd stage output signal.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A sense amplifier circuit having a 1st stage sense amplifier and a 2nd stage sense amplifier, comprising:

power source for said sense amplifier for providing a source voltage to a 1st stage sense amplifier, said 1st stage sense amplifier having a pair of first stage pass gate NFETs (Nsl & Nsr) as output devices for said 1st stage sense amplifier, each of said pair of first stage pass gate NFETs being gated by the arrival of a sense amplifier clock signal arriving at each pass gate to initiate amplification by said 1st state sense amplifier, each of said pass gates sized to be two times smaller than a PFET of equal strength, said 1st stage sense amplifier having two additional output NFETs coupled as a set of first stage cross coupled additional output NFETs, said first pair of first stage pass gate NFETs being coupled to said set of first stage cross coupled additional output NFETs whereby said first stage cross coupled additional output NFETs provide an output voltage as a repowered differential voltage from the first 1st stage sense amplifier to said 2nd stage sense amplifier of said sense amplifier circuit, said 2nd stage sense amplifier being timed off said 1st stage sense amplifier and having a pair of pass gate NFETs for passing an output voltage from the sense amplifier circuit.

2. A sense amplifier circuit according to claim 1 wherein, said 1st stage amplifier develops a repowered differential voltage from said source voltage and is coupled via said 1st stage amplifier's pass gates' couplings to send said repowered differential voltage to said 2nd stage amplifier for providing an output signal from said sense amplifier via the 2nd stage sense amplifier's pair of pass gate NFETs and for allowing said 1st and 2nd stage sense amplifiers to have a relatively low input capacitance and for preventing said source voltage from directly driving said 2nd stage amplifier and preventing activation of said 2nd stage amplifier twice in the same cycle.

3. A sense amplifier circuit according to claim 6 wherein, there is a plurality of 1st stage sense amplifiers provided for a 2nd stage sense amplifier of said sense amplifier circuit.

4. A sense amplifier circuit according to claim 3 wherein a pair of bit lines fan into said sense amplifier into the 1st stage sense amplifier.

5. A sense amplifier circuit according to claim 2 wherein, there is a plurality of 1st stage sense amplifiers each having a two bit lines fan-in, each of which plurality of 1st stage sense amplifiers is coupled to a single shared 2nd stage sense amplifier of said sense amplifier circuit, and wherein once any of said plurality of 1st stage sense amplifiers is activated it sends an output signal to said second amplifier and the activated 1st stage sense amplifier also sends a trigger signal to said 2nd stage amplifier to start 2nd stage amplification.

6. A sense amplifier circuit according to claim 5 wherein the trigger signal sent to the 2nd stage amplifier tracks varying chip-to-chip transistor characteristics and environmental conditions.

7. A sense amplifier circuit according to claim 6 wherein said plurality of 1st stage sense amplifiers provided for a 2nd stage sense amplifier of said sense amplifier circuit are wire-ORed into said 2nd stage sense amplifier which is provided with a reset circuit and said 2nd stage sense amplifier for all of said plurality of 1st stage sense amplifiers is self timed off a 1st stage sense amplifier trigger signal which generates a trigger signal for said 2nd stage sense amplifier.

8. A sense amplifier circuit according to claim 7 wherein each first stage amplifier's pass gate controls the passage of a voltage differential to said 2nd stage amplifier and prevents large bit line voltage differentials from self-triggering the 2nd stage amplifier.

* * * * *